United States Patent

[11] 3,615,628

[72] Inventors John W. Mench;
Brazelton Fulkerson; William J. Dulmage,
all of Rochester, N.Y.
[21] Appl. No. 693,710
[22] Filed Dec. 27, 1967
[45] Patented Oct. 26, 1971
[73] Assignee Eastman Kodak Company
Rochester, N.Y.

[54] PHOTOGRAPHIC ELEMENT AND COMPOSITION
7 Claims, No Drawings

[52] U.S. Cl. .......... 96/115, 96/36, 96/36.3, 96/36.4, 96/86, 96/91, 204/159.19, 260/75 UA, 260/75 A
[51] Int. Cl. .......... G03c 1/68
[50] Field of Search .......... 96/35.1, 91 N, 115, 115 P; 204/159.19

[56] References Cited

UNITED STATES PATENTS

| | | | |
|---|---|---|---|
| 2,861,058 | 11/1958 | Unruh et al. | 96/115 X |
| 2,948,706 | 8/1960 | Schellenberg et al. | 76/115 X |
| 3,255,006 | 6/1966 | Bailey | 96/115 X |
| 3,408,191 | 10/1968 | Jeffers | 96/35.1 X |
| 3,345,171 | 10/1967 | Laridon et al. | 96/91 X |
| 3,455,689 | 7/1969 | Laridon et al. | 96/35.1 |
| 3,462,268 | 8/1969 | Dennhauser et al. | 96/35.1 |
| 3,467,518 | 9/1969 | Laridon et al. | 96/35.1 |

*Primary Examiner*—Charles E. Van Horn
*Assistant Examiner*—R. E. Martin
*Attorneys*—W. H. J. Kline, J. R. Frederick and D. M. De Leo

ABSTRACT: Sensitized polyesters containing unsaturated alicyclic rings are coated upon a support material to provide negative-working photographic elements useful in the photomechanical arts for preparing not only lithographic and relief printing plates but also resist stencils for etching and other operations.

PHOTOGRAPHIC ELEMENT AND COMPOSITION

This invention relates to photography and especially to negative-working photographic elements having particular utility in the photomechanical reproduction art.

Photographic elements incorporating photosensitized polymers, wherein a light exposure initiates cross-linking of the sensitized polymer, are well known in the photomechanical art. Such elements are prepared by coating a support with a sensitizer and a polymer. They work in negative fashion. After exposure, uncrosslinked polymer is removed by solvent development, leaving an exposed, imagewise distribution of hydrophobic, ink-receptive polymer on the support. Such developed photographic elements can, depending on the choice of support, choice of polymer nd coating thickness, function as masters for lithographic printing, as masters for relief printing or as resist stencils for etching and other operations.

Accordingly, it is an object of this invention to provide, for photomechanical reproductions and photoresist purposes, for photomechanical reproductions and photoresist purposes, new light-sensitive compositions and photographic elements containing new polymeric material.

It is another object of this invention to provide a new process for preparing lithographic and relief printing plates.

Still another object of this invention is to provide a novel process for preparing resist stencils.

These and other objects of the present invention will become obvious from a consideration of the following description and appended claims.

The objects of this invention are accomplished with a light-sensitive composition comprising a polyester derived from a polyol and an unsaturated polycarboxylic acid and a sensitizing amount of an aryl ketone or aryl azide cross-linking sensitizer.

Polyols which are advantageously employed in producing the polyesters utilized in this invention include both aliphatic and alicyclic polyols. Suitable aliphatic polyols can be, for example, such polyhydroxy-containing compounds as lower alkane glycols having from one to six carbon atoms. Other aliphatic polyhydroxy polyols include homopolymers or copolymers of hydroxysubstituted lower alkyl acrylate esters wherein the alkyl moiety has from one to six carbon atoms. Alternatively, the aliphatic polyol can be a polydyroxylated carboxylic acid. Specific aliphatic polyols which exhibit particular utility in preparing the subject polyesters are, for example, ethylene glycol, 2,2-di(4-hydroxyethylphenyl)propane, netopentyl glycol, polyvinyl alcohol and poly or copoly acrylates where at least part of the acrylate is a hydroxyalkyl acrylate such as poly(hydroxyethylacrylate) and copoly(hydroxyethylacrylate methacrylate). Alicyclic polyols suitably employed in preparing the subject polyesters include cyclic alkanes, particularly cyclic alkanes having five to seven atoms in the carbocyclic nucleus, 1,4-di(hydroxymethyl)cyclohexane for example, and polyhydroxy-containing carbohydrates such as cellulosic compounds, including cellulose and cellulose derivatives. Typical cellulose derivatives include partially esterfied derivatives like cellulose acetate; partially alkylated derivatives such as methyl cellulose, ethyl cellulose and propylcellulose, and hydroxyalkylated cellulose derivatives like hydroxypropyl cellulose.

Unsaturated carboxylic acids which can be advantageously employed in the practice of this invention include compounds having the general formula:

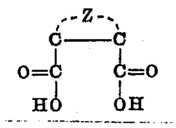

wherein Z represents the atoms necessary to form an unsaturated, bridged or unbridged carbocyclic nucleus typically having six to seven carbon atoms. Such a carbocyclic nucleus can be substituted or unsubstituted. Particularly suitable acid units are 4-cyclo-hexene-1,2-dicarboxylic acid, 5-norbornene-2,3-dicarboxylic acid, hexachloro-5[2:2:1]bicycloheptene-2,3-dicarboxylic acid and the like.

Such unsaturated polycarboxylic acids readily polycondense with the above-described polyols to form the polyesters useful in preparation of the present light-sensitive compositions. Mixtures of more than one polyol or more than one unsaturated polycarboxylic acid can be used. The subject polyesters are of two varieties, either essentially straight chain copolymers of a monomeric polyol and one of the unsaturated acids of this invention or copolymers incorporating an initially polymeric polyol and the subject acid units as side chains. Particularly suitable polyesters include, for example, the esterification products of: polyvinyl alcohol and cis-4-cyclohexene-1,2-dicarboxylic acid; polyvinyl alcohol and 5-norbornene-1,2-dicarboxylic acid; cellulose and cis-4-cyclohexene-1,2-dicarboxylic acid; hydroxypropylcellulose and cis-4-cyclohexene-1,2-dicarboxylic acid; polyvinyl alcohol, benzoyl chloride and cis-4-cyclohexene-1,2-dicarboxylic acid; methyl acrylatehydroxy-ethyl acrylate copolymer and cis-4-cyclohexene-1,2-dicarboxylic acid; the polycondensation product of ethylene glycol and cis-4-cyclohexene-1,2-dicarboxylic acid; ethylene glycol and 5-norbornene-2,3-dicarboxylic acid; and ethylene glycol, cis-4cyclohexene-1,2-dicarboxylic acid and hexachloro-5[2:2:1]- bicycloheptene-2,3-dicarboxylic acid. Additionally, amounts of other acids, such as terephthalic acid, or acid salts or esters can be incorporated into the reaction mixture to obtain particular desired polymer or reaction characteristics.

Polymers such as those whose preparations are described herein are advantageously light-sensitive when mixed with a suitable sensitizer which, upon exposure to ultraviolet or visible light radiation, promotes cross-linking of the subject polymers. Generally, keton-type and azide-type sensitizers are particularly useful in photomechanical operations. Typical aryl ketone sensitizers include such compounds as benz(a)anthracene-7,12-dione and 4,4'-bis(dimethylamino)benzophenone. Other advantageous ketone-type sensitizers are, for example, 4,4'-tetraethyldiaminodiphenyl keton, dibenzalacetone and 4,4'-bis-(dimethylamino)benzophenone imide, as well as additional compounds such as those described in U.S. Pat. No. 2,670,287. Azide-type sensitizers useful herein include a wide variety of aryl azides, such as those of British patents 767,985886,100 and 892,811, which are desirable sensitizers for negative-working elements. Additionally, the sensitizers of U.S. Pat. No. 2,940,853 can also be suitably employed in a like manner. Particularly useful aryl azide sensitizers are such bis aryl azides as 2,6-di-(4-azido-benzylidene)-4-methyl cyclohexanone and 4,4'-diazostilbene-2,2'disulfonic acid. Other advantageously employed azide sensitizers which promote conventional cross-linking are well known in the art. Sensitizers other than ketone and azide types are advantageous in photomechanical systems. Exemplary of such additional sensitizers are pyrylium compounds like 1,3,5-triphenyl pyrylium fluoborate and naphthalene derivatives like 3-methyl-2-benzoylmethylene-1,2(d)-naphthothiazoline.

The amount of sensitizer required to sensitize the above-noted polyesters to actinic light can be widely varied. It need only be a conventional sensitizing amount, however, and amounts in the range of about 1 to 20 percent based on the weight of the polyester can be advantageously employed herein, although such amounts can be more extensively varied in accordance with usual practice.

The production of a composite, light-sensitive photographic element useful in photomechanical reproduction operations is accomplished by coating a solution of the previously described polyester-sensitizer mixture upon a support material. This coating operating can be accomplished by any means known to those skilled in the art. Whirl-coating, dipping, swabbing, hopper coating, and doctor blade coating are typical examples of advantageously employed techniques.

The total weight of sensitizer and polymer can be widely varied in the final coating solution, with from less than 2 percent to over 30 percent of the total coating weight being typical. The particular percentage of solids in any given coating composition is largely dependent upon the method of coating and the use to which the photographic element will be applied. Coating thickness is also a function of intended use, and its limits are only those imposed by the concentrations of the coating composition and the technology presently available to those skilled in the coating arts. Typically, coating thickness is varied from about 0.5 mil to about 5 mils.

The choice of a support material for the polyesterazide sensitizer composition can be widely varied and depends upon that use to which the completed photographic element will be applied. Metals, such as copper, tin, aluminum, zinc and the like can be employed. Metal laminates, where a thin layer of a metal such as copper is bonded to a polymeric base material, are particularly suitable where subsequent etching is involved, as in the preparation of printed circuits, for example. Glass, paper and conventional photographic film bases such as cellulose acetate, polystyrene, cellulose nitrate, cellulose acetate butyrate, rate, polyethylene-coated paper and poly(ethylene terephthalate) are also advantageously utilized as support materials in the practice of the invention described herein. After coating, the photographic element is exposed imagewise through an original pattern. The light-sensitive layer is hardened or rendered insoluble in the light-exposed areas, the light exposure initiating the cross-linking of unsaturated polyester through the sensitizer in such exposed areas.

Subsequent to exposure, development is accomplished by treating the exposed photographic element with a suitable solvent, the coating solvent for example. To effect development, the exposed element can be, for example, sprayed with, dipped in or brushed with the developing solvent, whereupon the polymer in the unexposed areas is dissolved away. An exposed imagewise distribution of polymer remains, this constituting a negative reproduction of the original pattern. This negative polymer image is both hydrophobic and ink receptive, and the developed element can be suitably employed as a master for lithographic or relief printing or in etching operations. Suitable developing solvents vary with the particular polyester used in the light-sensitive composition, and these solvents can be readily determined by one skilled in the art.

The utility, in photomechanical reproduction applications, of such developed photographic elements as are described above will be obvious from the following examples, which serve only to illustrate particular embodiments of the present invention, and are not intended as limitations thereof.

The preparations of particular polyesters exhibiting utility in the practice of this invention are described in examples I to XXIV, wherein the anhydrides or easily hydrolized esters of the previously mentioned acids are used to facilitate preparation.

EXAMPLE I

Polyvinyl alcohol (8.8 g.) is dissolved in dimethyl-formamide (100 ml.) with stirring and heating in an oil bath. The polymer dissolves at 140°–145° C. At that temperature a solution of cis-4-cyclohexene-1,2-dicarboxylic anhydride (30.4 g.) in dimethylformamide (60 ml.), which has previously been heated to about 90° C., is added and heating and stirring are continued for half an hour at a 140–150° C. solution temperature. The solution is then allowed to cool, and the polymer is precipitated in diethyl ether (2 l.), washed with two further portions of ether and dried under vacuum. In this way, 25 g. of soft gummy polymer is obtained which is soluble both in ethanol and in dilute ammonia.

EXAMPLE II

Utilizing the method of example I, polyvinyl alcohol (8.8 g.) is esterified with cis-4-cyclohexene-1,2-dicarboxylic anhydride (15.2 g.). The polymer (17 g.) is soluble both in a 50:50 v/v mixture of ethanol and water and in dilute ammonia.

EXAMPLE III

Polyvinyl alcohol (50 g.) is suspended for 16 hours at about 25° C. in a mixture of acetic acid (250 g.) and cis-4-cyclohexene-1,2-dicarboxylic anhydride (200 g.). After this time period, anhydrous potassium acetate (100 g.) is added and the temperature of the reaction mixture is raised to 90°–95° C. A clear solution results in 20 minutes, and at the end of 1 hour, the solution is diluted with acetic acid and the polyvinyl cis-4-cyclohexene-1,2-dicarboxylate product is isolated by precipitation into a large quantity of acidified water. The resulting tacky precipitate is then ground in a water slurry and washed with distilled water until free of acidity. The resultant product is dried at about 25° C. under vacuum.

EXAMPLE IV

Utilizing the method of example I, polyvinyl alcohol (8.8 g.) is esterified with 5-norbornene-2,3-dicarboxylic anhydride (32.8 g.). The polymer (14 g.) is soluble both in a mixture of cyclohexanone and ethanol and in dilute ammonia.

EXAMPLE V

Utilizing the method of example I, polyvinyl alcohol (8.8 g.) is esterified with 5-norbornene-2,3-dicarboxylic anhydride (16.4 g.). The resulting polymer is soluble in a mixture of cyclohexanone and ethanol.

EXAMPLE VI

Utilizing the method of example I, hydroxypropylcellulose (11 g.) is esterified with cis-4-cyclohexene-1,2-dicarboxylic anhydride (11.4 g.). The polymer (13 g.) is soluble in ethanol.

EXAMPLE VII

Polyvinyl alcohol (22 g.) mixed with pyridine is stirred overnight in a steam bath. Then benzoyl chloride (17.6 is added dropwise with stirring. The elevated temperature is maintained. After 1 hour, a solution of cis-4-cyclohexene-1,2-dicarboxylic anhydride (57 g.) dissolved in dimethylformamide (80 ml.) is added. This reaction mixture is maintained at the elevated temperature and stirred for another hour, after which time the dope is precipitated in water. It is washed repeatedly in water, and the polymer (57 g.) is collected as an off-white powder, which is soluble in a 50:50 v/v mixture of cyclohexanone and ethanol. Log Viscosity Number = 20 ml./g.

EXAMPLE VIII

A copolymer of methyl acrylate (17.2 g.) and hydroxyethyl acrylate (5.8 g.) is prepared in acetone solution (200 ml.) using azo-diisobutyronitrile (0.12 g.) as a catalyst. The polymerization temperature is 50° C., and the polymer is precipitated in water after 118 hours. It is washed in water and dried under vacuum. Yield (20 g.). Log Viscosity Number = 59 ml./g.

$[C_{21}H_{32}0_{11}]_n$ theoretical: C, 54.8; H, 6.95%

Found: C, 55.4; H, 7.3%

This polymer (13.8 g.) is dissolved in dimethylformamide (100 ml.) with stirring in a steam bath. A solution of cis-4-cyclohexene-1,2-dicarboxylic anhydride (4.5 g.) dissolved in dimethylformamide (20 ml.) is added. Heating and stirring are continued for 5 hours, after which time the solution is allowed to cool. The polymer is then precipitated in water, washed with water and dried under vacuum. The polymer (17 g.) is soluble in a mixture of cyclohexanone and ethanol (50:50 v/v).

EXAMPLE IX

Cis-4-cyclohexene-1,2-dicarboxylic anhydride (45.6 g.) and freshly distilled ethylene glycol (19.5 g.) are placed in a 250 ml. three-necked round-bottomed flask, which flask is immersed in an oil bath and fitted with a stirrer, thermometer and gas inlet tube which dips below the level of the melt in the flask. A Vigreux column (10 inches long) connects the flask to a condenser and receiving flask. Stirring and heating are started and dry nitrogen is continuously bubbled through the melt. The mixture is heated for 4 hours to 180°–190° C. (bath temperature 200° C.). The bath temperature is then raised to 250°–260° C. when the inside temperature rises to 205°–210° C. After 3 hours the fractionation column is removed and the flask is connected to a condenser via a still head. The gas inlet tube is replaced by a capillary tube which reaches the bottom of the flask. A vacuum from a water pump is applied while heating to 260°–270° C. (bath hours, Stirring is continued. Nitrogen is bled into the air leak. The melt temperature rises to 245° C. After 1¾ hours, heating is stopped and the hot melt is poured into a dish where it sets to a light amber, slightly tacky, clear, glasslike mass. It is readily soluble in chloroform and in cyclohexanone and in mixtures of cyclohexanone and ethanol. Log Viscosity Number = 3 ml./g.

$[C_{10}H_{12}O_4]_n$ theoretical: C, 61.2; H, 6.12%
Found: C, 60.8; H, 6.34%

EXAMPLE X

This is similar to example IX but p-toluenesulphonic acid (0.45 g.) is added to the melt. The polymer appears slightly harder than the polymer of example IX, Log Viscosity Number = 9.4 ml./g.

$[C_{10}H_{12}O_4]_n$ theoretical: C, 61.2; H, 6.12%
Found: C, 59.6; H, 6.38%

EXAMPLE XI

This is similar to example IX but the charge is cis-4-cyclohexene-1,2-dicarboxylic anhydride (34.2 g.), maleic anhydride (7.4 g.) and ethylene glycol (19.6 g.). The period during which the melt is held under vacuum is reduced to 1 hour, as a crust begins to form on the surface of the molten mass. The cooled resin is fairly hard and brittle. It is soluble in chloroform, cyclohexanone and mixtures of cyclohexanone and ethanol. Log Viscosity Number = 9 ml./g.

$[C_{36}H_{42}O_{16}]_n$ theoretical: C, 59.2; H, 5.8%
Found: C, 58.4; H, 5.98%

EXAMPLE XII

This is similar to example IX but the following charge is placed in the flask: 5-norbornene-2,3-dicarboxylic anhydride (49 g.) and ethylene glycol (19.5 g.). The reaction proceeds similarly to example IX except that a crust begins to form on the surface of the melt after only 20 minutes at 210° C. (melt temperature) under vacuum. The reaction is stopped, yielding a clear pale amber resin which is slightly tacky. Log Viscosity Number = 6 ml./g.

$[C_{11}H_{12}O_4]_n$ theoretical: C, 63.46, H, 5.77%
Found: C, 61.1; H, 5.94%

EXAMPLE XIII

This is similar to example IX, but the charge is cis-4-cyclohexene-1,2-dicarboxylic anhydride (34.2 g.), phthalic anhydride (11.1 g.) and ethylene glycol (19.5 g.). Polymerization is carried out as described in example IX, except that heat is applied first to a bath temperature of 210°–220° C. for 4 hours and then to a bath temperature of 250°–260° C. for 3 hours. The melt is then allowed to cool overnight. A water pump vacuum is then applied and the melt is heated for 2½ hours at a bath temperature of 260°–270° C. On cooling, a pale yellow resinous polymer is obtained, it being readily soluble in chloroform, cyclohexanone and in mixtures of cyclohexanone and ethanol. Log Viscosity Number = 10 ml./g.

$[C_{40}H_{44}O_{16}]_n$ theoretical: C, 61.5; H, 5.8%
Found: C, 61.1; H, 6.02%

EXAMPLE XIV

This is similar to example IX, but the charge is cis-4-cyclohexene-1,2-dicarboxylic anhydride (34.2 g.), succinic anhydride (7.5 g.) and ethylene glycol (19.5 g.). Polymerization is carried out as in example IX, except that heat is applied first to a bath temperature of 200°–210° C. For 4 hours and then to a bath temperature of 240°–250° C. For 1½ hours. After cooling and application of a water pump vacuum, the melt is heated to a bath temperature of 250°–255° C. for 1½ hours. The polymer obtained is a soft solid which is soluble in common organic solvents. Log Viscosity Number = 10 ml./g.

$[C_{36}H_{44}O_{16}]_n$ theoretical: C, 59.01; H, 6.01%
Found: C, 58.0; H, 6.3%

EXAMPLE XV

This is similar to example IX, using the charge of example XIII, except that heating is applied first to a bath temperature of 200° C. for 4 hours and then to a bath temperature of 250° C. for 3 hours. After cooling and applying a water pump vacuum, the melt is heated to a bath temperature of 245°–250° C. for 1 hour. On cooling, a hard resin is obtained, it being readily soluble in chloroform, cyclohexanone and in mixtures of cyclohexanone and ethanol. Log Viscosity Number = 5 ml./g.

$[C_{40}H_{44}O_{16}]_n$ theoretical: C, 61.5; H, 5.8%
Found: C, 60.9; H, 6.05%

EXAMPLE XVI

This is similar to example IX, but the charge is cis-4-cyclohexene-1,2-dicarboxylic anhydride (45.6 g.) and neopentyl glycol (31.2 g.). Polymerization is carried out as described in example IX, except that heat is applied to a bath temperature of 200°–210° C. for 4 hours. Then a water pump vacuum is applied and the melt is heated to a bath temperature of 245°–255° C. for 2 hours. On cooling, a pale resin is obtained which is freely soluble in common organic solvents such as chloroform, cyclohexanone and in mixtures of cyclohexanone and ethanol. Log Viscosity Number = 4 ml./g.

$[C_{13}H_{18}O_4]_n$ theoretical: C, 66.1; H, 7.6%
Found: C, 60.1; H, 8.15%

EXAMPLE XVII

This is similar to example IX, but the charge is cis-4-cyclohexene-1,2-dicarboxylic anhydride (119.7 g.), hexachloro-[2:2:1]-bicycloheptene dicarboxylic anhydride (41.7 g.) and ethylene glycol (58.5 g.). Polymerization is carried out as described in example IX, except that heat is applied first to a bath temperature of 250° C. for 2½ hours. The melt is then allowed to cool, after which water pump vacuum is applied and heating is continued, first for 1½ hours at a bath temperature of 220° C. and then for 15 minutes at a bath temperature of 250° C. On cooling, a clear brown resin is obtained, it being soluble in common organic solvents such as chloroform, cyclohexanone and in mixtures of cyclohexanone and water. Log Viscosity Number = 5 ml./g.

$[C_{81}H_{90}Cl_6O_{32}]_n$ theoretical: C, 54.5; H, 5.03; Cl, 11.9%
Found: C, 54.3; H, 5.15; Cl, 11.22%

EXAMPLE XVIII Cl,

This is similar to example IX, but the charge is cis-4-cyclohexene-1,2-dicarboxylic anhydride (36.48 g.), hexachloro-[2:2:1]-bicyclopheptene dicarboxylic anhydride (22.26 g.) and ethylene glycol (19.5 g.). Polymerization is carried out as described in example IX, except that heat is applied first to a bath temperature of 200° C. for 4 hours and then to a bath temperature of 250° C. for 2½ hours. The melt is then allowed to cool, after which a water pump vacuum is applied and heating is continued for 1½ hours at a bath temperature of 220° C. and then for 15 minutes at a bath temperature of 250° C. On cooling, a dark, clear resin is obtained, it being soluble in common organic solvents such as chloroform, cyclohexanone and mixtures of cyclohexanone and ethanol. Log Viscosity Number = 8 ml./g.

$[C_{51}H_{54}Cl_6O_{20}]_n$ theoretical: C, 51.04; H, 4.5; cl. 17.76%
Found: C, 51.05; H, 4.76; Cl, 17.6%

EXAMPLE XIX

This is similar to example IX, but the charge is cis-4-cyclohexene-1,2-dicarboxylic anhydride (39.3 g.), tetrachlorophthalic anhydride (10.7 g.) and ethylene glycol (19.5 g.). Polymerization is carried out as described in Example IX, except that heat is applied first to a bath temperature of 200° C. for 4½ hours and then to a bath temperature of 250° C. for 2½ hours. The melt is then allowed to cool, after which a water pump vacuum is applied and heating is continued at bath temperatures of 220° C. for ½ hour, 230° C. for 1½ hours and 250° C. for 15 minutes. Upon cooling, a pale yellow clear resin is obtained, it being soluble in common organic solvents such as chloroform, cyclohexanone and mixtures of cyclohexanone and ethanol. Log Viscosity Number = 7 ml./g.

$[C_{80}H_{88}Cl_4O_{32}]_n$ theoretical: C, 56.4; H, 5.12; Cl, 8.3%
Found: C, 56.0 H, 5.6; Cl, 8.6%

EXAMPLE XX

This is like example XIX, except that the heating cycle is first to bath temperatures of 220° C. for 4 hours and then 250° C. for 2 hours. After cooling, the melt is placed under a water pump vacuum and heating is continued at a bath temperature of 220°-230° C. for 1½ hours. Upon cooling, a hard yellow resin is obtained, it being soluble in common organic solvents such as chloroform, cyclohexanone and mixtures of cyclohexanone and ethanol. Log Viscosity Number = 6 ml./g.

$[C_{80}H_{88}Cl_4O_{32}]_n$ theoretical: C, 56.4; H, 4.12; Cl,8.3%
Found: C, 56.2; H 15.4; Cl, 8.2%

EXAMPLE XXI

Dimethyl cis-4-cyclohexene-1,2-dicarboxylate (19.8 g.), ethylene glycol (14 g.), calcium acetate (0.03 g.) and antimony trioxide (0.007 g.) are placed in a 50 ml. round-bottomed flask fitted with a Claisen head and a gas inlet tube reaching to the bottom of the flask. The Claisen head is connected to a condenser and a receiving flask. Nitrogen is bubbled through the flask which is heated in an oil bath. At 220°-230° C. bath temperature, methanol begins to distill off. This distillation is continued for 6 hours after which time the alcohol ceases to come off. After cooling overnight in a nitrogen atmosphere, the gas inlet tube is replaced by a capillary tube, heating is started and the apparatus is connected to a water pump vacuum while nitrogen is bled into the capillary. The bath is heated to 220° C. and held there for half an hour. During this time the last traces of methanol distill off together with excess glycol. The apparatus is then connected to a high vacuum pump and the vacuum is reduced to 0.7 mm. The temperature is raised to 280°- 290° C., where ethylene glycol distills off. After 2 hours the reaction is essentially complete, and the melt is allowed to cool. It solidifies to a pale green glass (color is due to catalyst decomposition product) which on softening can be drawn into filaments. The polymer is soluble in chloroform, cyclohexanone and in a cyclohexanoneethanol mixture. Log Viscosity Number =12 ml./g. Softening point about 60° C.

$[C_{10}H_{12}O_4]_n$ theoretical: C, 61.2; H, 6.12%
Found: C, 61.8; H, 6.4%

EXAMPLE XXII

Dimethyl cis-4-cyclohexene-1,2-dicarboxylate (31.6 g.) dimethyl terephthalate (7.8 g.) and ethylene glycol (26 g.) are placed in a 50 ml. round-bottomed flask fitted with a Claisen head and a gas inlet tube reaching to the bottom of the flask. The Claisen head is connected to a condenser and receiving flask. In the alternative, 1,4-cyclohexane dimethanol can be substituted for the ethylene glycol. Nitrogen is bubbled through the flask and the catalyst, calcium acetate monohydrate (0.060 g.) and antimony trioxide (0.012 g.) is added. The flask is heated in an oil bath to a 240° C. bath temperature, and held at this temperature for 1¾ hours. The temperature is then raised to 240°-250° C. for 2½ hours and finally to 250°-260° C. for a further 2 hours. During this time 13 ml. of methanol was collected. Alternatively, this ester interchange reaction can be accomplished using a zinc-titanium catalyst and a phosphorus stabilizer. After cooling, the flask is connected to a Vigreux column (10 inches) and from there via a still head to a condenser and a receiving flask. The gas inlet tube is replaced by a capillary tube and the apparatus is connected to a high vacuum pump. Nitrogen is passed down the capillary tube and a vacuum of 0.35 mm./hg. is maintained. The oil bath is now heated to 260° C. and held at that temperature for 1 hour after which the temperature is raised to 270°-280° C. for a further 1½ hours. During this time ethylene glycol distills from the melt. After cooling the polymer is obtained as a clear pale resin. It is soluble in cyclohexanone, chlorobenzene, chloroform, etc. Log Viscosity Number =13 ml./g.

$[C_{50}H_{56}O_{20}]_n$ theoretical: C, 61.4; H, 5.7%
Found: C, 61.1; H, 6.1%

EXAMPLE XXIII

This is similar to example XXII, but titanium isopropoxide (8 drops from a dropping tube) is used in place of the calcium acetate/antimony trioxide as catalyst. The polymer is pale amber in color. It is soluble in organic solvents such as chloroform, cyclohexanone, mixture of cyclohexanone and methanol, chlorobenzene, etc. Log Viscosity Number =23 ml./g.

$[C_{50}H_{56}O_{20}]_n$ theoretical: C, 61.4; H, 5.7%
Found: C, 60.8; H, 6.09%

EXAMPLE XXIV

Fifty g. of cotton linters are heated at 90°-95° C. for 20 minutes in a mixture of 2.5 g. of sulfoacetic acid, 12.5 g. of acetic anhydride and 250 g. of acetic acid. To the resulting slurry is added 200 g. of cis-4-cyclohexene-1,2-dicarboxylic anhydride(tetrahydrophthalic anhydride) and 125 g. of anhydrous potassium acetate. After approximately 6 hours reaction at 90°-95° C., a clear solution results. This is held for an additional 16 hours at 90°-95° C., then is diluted with acetic acid and the ester isolated by precipitation into water which has been acidified with hydrochloric acid. The product is washed with distilled water until acid free, then dried at room temperature under vacuum. Alternatively, it is possible to dry the product at elevated temperature without causing insolubility by addition of sufficient stabilizer, such as hydroquinone, to the last wash water so that approximately 0.5 percent is retained by the ester.

The polymers, such as those described in examples I to XXIV, are rendered advantageously light sensitive by the addition of sensitizers of the types noted hereinabove. Particular sensitizers are employed in the remaining examples, which describe the negative-working photographic elements. These sensitizers are referred to by number, the subsequent references being as follows:

Sensitizer 1: 3% solution of 2,6-di(4-azido-benzylidene)-4-methylcyclohexanone in cyclohexanone.

Sensitizer 2: 4% of 4,4′-diazidostilbene-2,2′-disulphonic acid in 1% aqueous ammonia.

Sensitizer 3: 3% solution of benz(a)anthracene-7,12-dione in acetone and water (90:10)

Sensitizer 4: 3% solution of 4,4-bis(dimethylamino) benzophenone in acetone and water (90:10)

EXAMPLE XXV

A sheet of anodized aluminum is whirler coated at 200 r.p.m. with the following solution:

Resin (as in example I—97 g./l. in ethanol) 1.0 ml.
Sensitizer 1—3.2 ml.
Ethanol—20.0 ml.

The dry layer is exposed for 1 minute through a negative line transparency to four 125 w. high-pressure mercury vapor lamps, rich in ultraviolet light, placed 18 inches from the exposure plane. Exposure causes the sensitized polymer to harden in the areas of exposure. The exposed plate is developed by swabbing with a 10 percent aqueous solution of trisodium phosphate, which causes the polymer in the unexposed areas to dissolve away. The developed plate is then rinsed with water, swabbed with a mixture of gum arabic (2.5 percent) and phosphoric acid (5 percent) and linked to give a lithographic plate. One thousand impressions are typically obtained on a standard rotary lithographic printing machine with no loss of image quality.

EXAMPLE XXVI

A lithographic plate is prepared by coating a sheet of anodized aluminum with the following solution according to the method of example XXV:

Resin (as in example I—62 g./l. in aqueous ammonia)—4.0 ml.
Sensitizer 2—6.2 ml.

The layer is exposed as in example XXV and developed by swabbing with an 0.5% aqueous solution of trisodium phosphate. Development causes the polymer in the unexposed areas to dissolve away. The plate produces clear ink impressions on a rotary lithographic printing machine.

EXAMPLE XXVII

A sheet of flexible poly(ethyleneterephthalate) .003 inch copper laminate is whirl coated at 200 r.p.m. with the following solution:

Resin [as in example II—100 g./l. in alcohol and water (1:1)]—15 ml.
Sensitizer 2—5 ml.

The dry layer is exposed for 2 minutes to the light source of example XXV. The exposed sheet is then developed by immersion in a 10% aqueous trisodium phosphate solution, followed by spraying with ethyl alcohol, thereby causing the polymer in the unexposed areas to be dissolved away. The developed element produces clear impressions on a standard rotary lithographic printing machine.

EXAMPLE XXVIII

A lithographic plate is prepared by swab coating a sheet of anodized aluminum with a solution having the following composition:

Resin (as in example V—64 g./l. in cyclohexanone)—1.0 ml.
Sensitizer 1—2.0 ml.
Ethanol/cyclohexanone mixture (1:1)—10.0 ml.

The layer is exposed as described in example XXVII for 10 minutes and developed by swabbing with ethanol, which causes the polymer in the unexposed areas to be dissolved away. The developed plate produces high-quality impressions on a standard rotary lithographic printing machine.

EXAMPLE XXIX

A sheet of poly(ethyleneterephthalate)-copper laminate (as described in example XXVII) is whirl-coated at 200 r.p.m. with the following solution:

Resin (as in example V—64 g./l. in cyclohexanone)—15.0 ml.
Sensitizer 2—5.0 ml.

The layer is exposed for 2 minutes as in example XXV. The exposed sheet is developed by immersion in a 10% aqueous solution of trisodium phosphate for 1 minute followed by spraying with ethanol, which causes the polymer in the unexposed areas to be dissolved away. The unprotected areas of copper are removed by spraying with an aqueous solution of ferric chloride (38° B.). The polymer image is not degraded by the etching solution.

EXAMPLE XXX

A lithographic plate is prepared by whirl coating a sheet of anodized aluminum with a solution having the following composition.

Resin (as in example V—78 g./l. ammonical solution)—1.0 ml.
Sensitizer 2—2.0 ml.
Water—10.0 ml.

The layer is exposed as in example XXVII for 10 minutes and developed by swabbing with a 10% aqueous solution of trisodium phosphate, which causes the polymer in the unexposed areas to be dissolved away. Clear impressions are obtained on a standard rotary lithographic printing machine.

EXAMPLE XXXI

A lithographic plate is prepared by swab coating a sheet of anodized aluminum with a solution having the following composition:

Resin [as in example VI—50 g./l. in water/ethanol (1:1) mixture]—4.0 ml.
Sensitizer 2—5.0 ml.

The layer is exposed as in example XXVII for 6 minutes and then developed using a 10% aqueous solution of trisodium phosphate, which causes the polymer in the unexposed areas to be dissolved away. Clear impressions are obtained on a standard rotary lithographic printing machine.

EXAMPLE XXXII

A sheet of poly(ethylene terephthalate)-copper laminate is whirl coated with the following solution:

Resin (as in example VII—62 g./l. in cyclohexanone/ethanol)—3.0 ml.
Sensitizer 1—0.7 ml.

The layer is exposed for 10 minutes as described in example XXVII and developed for 50 seconds in a mixture of cyclohexanone and ethanol (1:1). The polymer in the unexposed areas is dissolved away. The developed element is then etched with ferric chloride, which does not degrade the resist image.

EXAMPLE XXXIII

A lithographic plate is prepared by whirl-coating a sheet of anodized aluminum with a solution having the following composition:

Resin (as in example VIII—73 g./l. in ethanol/ethyl acetate)—1.0 ml.
Sensitizer 1—2.4 ml.
Ethanol/cyclohexanone (1:1)—10.0 ml.

The layer is exposed for 10 minutes as described in example XXVII and developed by swabbing with a mixture of ethanol and cyclohexanone (1:1). The polymer in the unexposed areas is dissolved away. Clear impressions are produced on a standard rotary lithographic printing machine.

EXAMPLE XXXIV

A sheet of flexible poly(ethylene terephthalate)-copper laminate is whirl-coated with the following solution:

Resin (as in example VIII—73 g./l. in ethanol/ethyl acetate)—3.0 ml.
Sensitizer 1—7.4 ml.

The coated layer is exposed for 10 minutes as described in example XXVII and developed by immersion in an ethanol/cyclohexanone mixture (1:1) for 2 minutes. The polymer in the unexposed areas is dissolved away. The developed element is then etched with ferric chloride, with no degradation of the resist image occurring.

EXAMPLE XXXV

A lithographic plate is prepared by whirl-coating a sheet of anodized aluminum with a solution having the following composition:

Resin (as in example IX—50 g./l. in cyclohexanone)—4.0 ml.
Sensitizer 1—3.3 ml.
Ethanol/cyclohexanone (1:1)—20.0 ml.

The coated layer is exposed for 1 minute as described in example XXVII and developed by swabbing with a mixture of ethanol and cyclohexanone (1:1). The polymer in the unexposed areas is dissolved away. One thousand high-quality impressions are made on a standard rotary lithographic printing machine.

EXAMPLE XXXVI

A lithographic plate is prepared by whirl-coating a sheet of anodized aluminum with the following solution:

Resin (as in example X—50 g./l. in cyclohexanone)—1.0 ml.
Sensitizer 1—1.7 ml.
Ethanol/cyclohexanone (1:1)—20.0 ml.

The layer is exposed for 10 minutes as described in example XXVII and developed by swabbing with a mixture of ethanol/cyclohexanone (1:1). The polymer in the unexposed areas is dissolved away. Clear impressions are produced on a standard rotary lithographic printing machine.

EXAMPLE XXXVII

A lithographic plate is prepared by whirl coating a sheet of anodized aluminum with the following solution:

Resin (as in example XI—50 g./l. in cyclohexanone)—3.0 ml.
Sensitizer 1—1.7 ml.
Ethanol/cyclohexanone (1:1)—10.0 ml.

The layer is exposed for 5 minutes as described in example XXVII and developed by swabbing with a mixture of ethanol and cyclohexanone (1:1), removing polymer in the unexposed areas. Clear impressions are produced on a standard rotary lithographic printing machine.

EXAMPLE XXXVIII

A lithographic plate is prepared by whirl-coating a sheet of anodized aluminum with a solution having the following composition:

Resin (as in example XII—50 g./l. in cyclohexanone)—1.0 ml.
Sensitizer 1—1.7 ml.
Ethanol/cyclohexanone—10.0 ml.

The layer is exposed for three minutes as described in example XXVII and developed by swabbing with a mixture of ethanol and cyclohexanone (1:1), causing the polymer in the unexposed areas to be dissolved away. Clear impressions are obtained on a standard rotary lithographic printing machine.

EXAMPLE XXXIX

A lithographic plate is prepared by whirl-coating a sheet of anodized aluminum with the following solution:

Resin (as in example XIII—50 g./l. in cyclohexanone)—1.0 ml.
Sensitizer 1—1.7 ml.
Ethanol/cyclohexanone (1:1)—10.0 ml.

The coating is exposed for 10 minutes as described in example XXVII and developed by swabbing with ethanol/cyclohexanone mixture. The polymer in the unexposed areas is dissolved away. One thousand clear impressions are made on a standard rotary lithographic printing machine.

EXAMPLE XL

A sheet of flexible copper laminate is whirl coated with the following solution:

Resin (as in example XIII—50 g./l. in cyclohexanone)—6.0 ml.
Sensitizer 1—1.0 ml.

The layer is exposed for 10 minutes as described in example XXVII and developed for 1 minute in an ethanol/cyclohexanone mixture (1:1). Polymer in the unexposed areas is dissolved away. The unprotected copper is etched with ferric chloride solution, with no degradation of the polymeric resist image occurring.

EXAMPLE XLI

A sheet of zinc is whirl coated with the following solution:

Resin (as in example XIII—100 g./l. in cyclohexanone)—5 ml.
Sensitizer 1—2 ml.

The layer is exposed for 10 minutes as described in example XXVII and developed for 1 minute in an ethanol/cyclohexanone mixture (1:1) which causes the polymer in the unexposed areas to be dissolved away. After drying, the element is etched with 12 percent nitric acid to which is added decahydronaphthalene as a solvent and sulfated castor oil as a wetting agent. The unprotected zinc support is etched to a depth of 0.020 inch, providing a suitable relief printing plate. The polymeric resist image is not degraded.

EXAMPLE XLII

A sheet of glass is coated at a 0.003 inch wet thickness by means of a doctor blade with the following solution:

Resin (as in example XXIV—125 g./l. in acetone)—90 ml.
Sensitizer 3—10 ml.

The coating so produced is then cured for about 5 minutes at about 25° C. and then for 2 hours at 50° C., to produce a composite photographic element. The complete element is then imagewise exposed through a halftone negative pattern to a 300 w. mercury vapor lamp (rich in ultraviolet rays) held about 7 inches from the exposing plane. An exposure time of about 4 minutes is required to insolubilize the exposed polymer, after which the element is washed with acetone to remove unexposed polymer. The remaining, imagewise exposed distribution of polymer is hydrophobic and accepts greasy printing inks. High-quality lithographic prints are obtained.

EXAMPLE XLIII

Three photographic elements are coated, cured and exposed according to the procedure outlined in example XLII, except that the coating compositions have the formulas:

1. Resin (as in example III—150 g./l. in acetone)—200 ml.
2. Resin (as in example III—150 g./l. in acetone)—200 ml.
Sensitizer 4—10 ml.
3. Resin (as in example III—150 g./l. in acetone)—200 ml.
Sensitizer 4—30 ml.

and the lengths of exposure time necessary to effect insolubilization are as follows:

| Amount of Sensitizer | Exposure Time |
|---|---|
| 1. none | 60 min. |
| 2. 1% by weight | 7 min. |
| 3. 3% by weight | 4 min. |

The varying exposure requirements illustrate the increased light sensitivity of the sensitized elements. Each element is then washed with acetone to produce an exposed imagewise distribution of polymer on the support. High-quality lithographic prints are obtained from each.

EXAMPLE XLIV

An aluminum lithographic plate is whirl-coated with a solution having the formula:

Resin (as in example XXII—62.5 g./l. in 1,1,1-trichloroethylene)—90 ml.

Sensitizer 3 (in 1,1,1-trichloroethylene)—10 ml.

after which the coating is dried at about 25° C. for 1 hour to produce a photographic element. The element is then exposed for 10 minutes through a halftone negative and ⅛-inch plate glass to the light of a 300 w. mercury vapor lamp (rich in ultraviolet rays) held about 6 inches from the exposing plane. Subsequent to exposure, development is accomplished by washing in 1,1,1-trichloroethylene, which produces a high-quality positive halftone polymer image from which high-quality reproductions are obtained on a standard rotary lithographic printing machine.

Although the invention has been described in considerable detail with particular reference to certain preferred embodiments thereof, it will be understood that variations and modifications can be effected within the spirit and scope of the invention as described hereinabove, and as defined in the appended claims.

We claim:

1. A light-sensitive composition consisting essentially of a polyester that is light-sensitive when mixed with a sensitizer, said polyester being derived from a polyol selected from the group consisting of a. lower alkane glycols,
b. polyvinyl alcohol,
c. homopolymers and copolymers of hydroxyalkylacrylate esters,
d. polyhydroxy cycloalkanes, and
e. polyhydroxy-containing carbohydrates, and an unsaturated acid having the formula

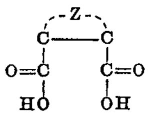

wherein $Z$ represents the atoms necessary to form an ethylenically unsaturated, alicyclic carbocyclic nucleus having six to seven carbon atoms, and a sensitizing amount of a sensitizer selected from the group consisting of aryl ketone sensitizers and aryl azide sensitizers.

2. A light-sensitive composition as described in claim 1, wherein the unsaturated carboxylic acid is 4-cyclohexene-1,2-dicarboxylic acid.

3. A light-sensitive composition as described in claim 1, wherein the unsaturated carboxylic acid is 5-norbornene-2,3-dicarboxylic acid.

4. A light-sensitive composition as described in claim 1, wherein the polyester is a compound selected from the group consisting of:

a. the esterification product of polyvinyl alcohol and 4-cyclohexene-1,2-dicarboxylic acid,
b. the esterification product of ethylene glycol and 4-cyclohexene-1,2-dicarboxylic acid,
c. the esterification product of polyvinyl alcohol and 5-norbornene-2,3-dicarboxylic acid,
d. the esterification product of hydroxypropyl-cellulose and 4-cyclohexene-[1,2-dicarboxylic acid,]
e. the esterification product of ethylene glycol and 5-norbornene-2,3-dicarboxylic acid,
f. the esterification product of ethylene glycol, 4-cyclohexene-1,2-dicarboxylic acid and terephthalic acid, and
g. the esterification product of ethylene glycol, 4-cyclophexene-1,2-dicarboxylic acid and terephthalic acid.

5. A light-sensitive composition as described in claim 1, wherein the sensitizer is further selected from the group consisting of:

a. 2,6-di(4-azidobenzylidene)-4-methylcyclohexanone.
b. 4,4′-diazidostilbene-2,2-disulfonic acid,
c. benz(a)anthracene-7,12-dione, and
d. 4,4-bis(dimethylamino)benzophenone.

6. A photographic element comprising a support having coated thereon a light-sensitive composition as described in claim 1, wherein the support is selected from the group consisting of aluminum and glass.

7. A photographic element comprising a support having coated thereon a light-sensitive composition as described in claim 1, wherein the support comprises a thin layer of copper laminated onto a polymeric support material.

* * * * *